United States Patent
Lu et al.

(10) Patent No.: US 8,822,331 B2
(45) Date of Patent: Sep. 2, 2014

(54) ANCHORED DAMASCENE STRUCTURES

(75) Inventors: David Lu, Hsinchu (TW); Horng-Huei Tseng, Hsinchu (TW); Syun-Ming Jang, Hsin-Chu (TW)

(73) Assignee: Taiwan Semiconductor Manufacturing Co. Ltd., Hsin-Chu (TW)

( * ) Notice: Subject to any disclaimer, the term of this patent is extended or adjusted under 35 U.S.C. 154(b) by 257 days.

(21) Appl. No.: 13/038,580

(22) Filed: Mar. 2, 2011

(65) Prior Publication Data

US 2012/0142188 A1 Jun. 7, 2012

Related U.S. Application Data

(63) Continuation of application No. 11/252,498, filed on Oct. 18, 2005.

(51) Int. Cl.
*H01L 21/4763* (2006.01)
*H01L 21/768* (2006.01)
*H01L 23/522* (2006.01)
*H01L 23/532* (2006.01)

(52) U.S. Cl.
CPC ..... *H01L 21/76802* (2013.01); *H01L 23/53238* (2013.01); *H01L 23/53295* (2013.01); *H01L 21/76807* (2013.01); *H01L 21/76831* (2013.01); *H01L 23/5226* (2013.01)
USPC .................................. 438/637; 257/E21.578

(58) Field of Classification Search
USPC ................................. 438/637; 257/E21.578
See application file for complete search history.

(56) References Cited

U.S. PATENT DOCUMENTS

| | | | | | |
|---|---|---|---|---|---|
| 4,902,377 | A | * | 2/1990 | Berglund et al. | 438/640 |
| 5,782,673 | A | * | 7/1998 | Warehime | 451/2 |
| 5,821,141 | A | * | 10/1998 | Huang | 438/253 |
| 5,843,845 | A | * | 12/1998 | Chung | 438/713 |
| 6,258,707 | B1 | * | 7/2001 | Uzoh | 438/618 |
| 6,387,824 | B1 | * | 5/2002 | Aoi | 438/778 |
| 2002/0052098 | A1 | * | 5/2002 | Chang | 438/585 |
| 2003/0008497 | A1 | * | 1/2003 | Lin et al. | 438/637 |
| 2003/0020180 | A1 | * | 1/2003 | Ahn et al. | 257/786 |
| 2004/0140563 | A1 | * | 7/2004 | Ahn | 257/751 |
| 2005/0110147 | A1 | * | 5/2005 | Wu et al. | 257/758 |
| 2005/0280152 | A1 | * | 12/2005 | Fitzsimmons et al. | 257/750 |

* cited by examiner

*Primary Examiner* — Asok K Sarkar
*Assistant Examiner* — Igwe U Anya
(74) *Attorney, Agent, or Firm* — Tung & Associates

(57) ABSTRACT

An anchored conductive damascene buried in a multi-density dielectric layer and method for forming the same, the anchored conductive damascene including a dielectric layer with an opening extending through a thickness of the dielectric layer; wherein the dielectric layer comprises at least one relatively higher density portion and a relatively lower density portion, the relatively lower density portion forming a contiguous major portion of the dielectric layer; and, wherein the opening in the relatively lower density portion has a lateral dimension relatively larger compared to the relatively higher density portion to form anchoring steps.

20 Claims, 4 Drawing Sheets

ANCHORED DAMASCENE STRUCTURES

This is a Continuation of a co-pending application Ser. No. 11/252,498, filed on Oct. 18, 2005.

FIELD OF THE INVENTION

This invention generally relates to multi-level semiconductor devices manufacturing methods and more particularly to damascene interconnect structures provided with anchoring features and a method of forming the same within a dielectric layer to improve a conductive filling stability and resistance to stress migration or CMP peeling.

BACKGROUND OF THE INVENTION

In forming damascene interconnect structures in integrated circuit manufacturing processes, the reliability and mechanical strength of the metal damascene interconnect structures is increasingly critical as the use of low-K dielectric layers proliferates. Increasingly, low-K dielectrics are used in metal damascene interconnects to reduce signal delay and power loss as integrated circuit device critical dimensions are scaled down. A drawback of low-K dielectric materials, which typically include an increased level of porosity, is reduced mechanical strength and adhesion of overlying layers as well as adhesion of the metal filling in a damascene interconnect structure.

The problem of reduced mechanical strength and adhesion can manifest itself in many ways including delamination during subsequent processing steps such as CMP which can exert a delaminating stress, also referred to as stress migration. In addition, thermal mismatch stresses can lead to stress migration including delamination of device layers.

There is therefore a need in the integrated circuit manufacturing art to develop a semiconductor device including metal damascene interconnects that have an improved resistance to stress migration to improve semiconductor device yield and reliability.

It is therefore among the objects of the present invention to provide a semiconductor device including metal damascene interconnects, and a method for forming the same, that have an improved resistance to stress migration to improve semiconductor device yield and reliability, while overcoming other shortcomings of the prior art.

SUMMARY OF THE INVENTION

To achieve the foregoing and other objects, and in accordance with the purposes of the present invention, as embodied and broadly described herein, the present invention provides an anchored conductive damascene buried in a multi-density dielectric layer and method for forming the same.

In a first embodiment, the anchored conductive damascene includes a dielectric layer with an opening extending through a thickness of the dielectric layer; wherein the dielectric layer comprises at least one relatively higher density portion and a relatively lower density portion, the relatively lower density portion forming a contiguous major portion of the dielectric layer; and, wherein the opening in the relatively lower density portion has a lateral dimension relatively larger compared to the relatively higher density portion to form anchoring steps.

In another embodiment, the method includes forming a dielectric substrate comprising at least one relatively higher density portion and a relatively lower density portion forming a contiguous major portion of the dielectric substrate; forming an opening extending through a thickness of the dielectric substrate; and, enlarging a lateral dimension of the opening in the relatively lower density portion with respect to the relatively higher density portion to form anchoring steps.

These and other embodiments, aspects and features of the invention will be better understood from a detailed description of the preferred embodiments of the invention which are further described below in conjunction with the accompanying Figures.

DETAILED DESCRIPTION OF THE PREFERRED EMBODIMENTS

Although the present invention is explained by reference to an exemplary dual damascene formation process, it will be that the method of the present invention applies generally to the formation of damascenes including single damascenes and vias (contacts) whereby a multi-layer inter-metal dielectric (IMD) layer is formed with anchoring features (steps) to improve a resistance to stress migration. It will be appreciated that the anchoring structure and process for forming the same may be equally applied in forming bonding pads and wide trenches.

By the term damascene is meant any metal filled opening formed in a dielectric layer including single and dual damascenes as well as vias or contacts. Further, it will be appreciated that any electrically conductive material may be used to fill the damascenes including metals such as tungsten, aluminum, copper, and alloys thereof. The method of the structure of the present invention is particularly advantageous in the formation of damascene features such as vias and/or trench lines with linewidths/diameters less than about 0.25 microns, more preferably less than about 0.18 microns, e.g., 0.13 microns and lower. In addition, the method of the structure of the present invention is particularly advantageous with IMD layers including a major portion formed with silicon oxide based low-K materials having an interconnecting porous structure and having a dielectric constant of less than or equal to about 2.7, for example from about 2.2 to about 2.7.

For example, in an exemplary embodiment, referring to FIGS. 1A-1E, are shown cross sectional views of a portion of a multi-level semiconductor device at stages in an integrated circuit manufacturing process.

Figure 1A:
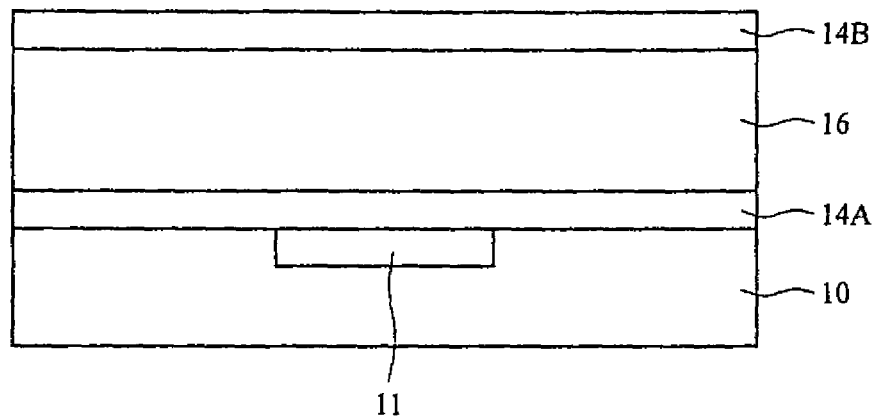
FIGS. 1A to 1E are cross sectional views of a dual damascene structure at stages of manufacture according to an embodiment of the invention.

Referring to FIG. 1A, a conductive region 11 is provided in a lowermost material layer portion 10. It will be appreciated that the conductive region 11 may be an underlying damascene conductive interconnect formed in an underlying dielectric layer or a salicide (self aligned silicide) contact region making up a portion of a CMOS device (not shown), e.g., source and drain regions or an uppermost portion of a gate electrode (not shown).

Still referring to FIG. 1A, a first dielectric layer 14A is optionally formed over the underlying material layer 10 and conductive region 11. The first dielectric layer 14A may be formed by conventional processes including plasma enhanced chemical vapor deposition (PECVD), atmospheric pressure (AP) CVD, or low pressure (LP) CVD processes. Preferably the first dielectric layer 14A has a dielectric constant of less than about 5.0, and functions as an etch stop layer or a passivation layer for the metal conductor below. Exemplary, preferably materials for the first dielectric layer 14A include carbon and nitrogen containing materials such as SiN, SiON, SiOC, SiCN, and SiOCN. In an important aspect of the invention, the first dielectric layer is preferably deposited at a thickness of about 500 Angstroms or less.

Still referring to FIG. 1A, a second dielectric layer portion 16, making up a major portion of an IMD layer is then formed on the first dielectric layer 14A. The second dielectric layer is formed at a predetermined contiguous thickness depending on whether a dual or single damascene structure is being formed, for example, from about 2500 Angstroms to about 6000 Angstroms in thickness for the formation of a dual damascene structure. The second dielectric layer 16 is preferably formed of a low-K material and has a dielectric constant of less than about 2.7 and a relatively lower density compared to the first dielectric layer 14A. Exemplary, and preferable low-K materials include porous silicon oxide based materials, for example having an interconnecting porous structure having a porous volume percent with respect to an arbitrary volume of the second dielectric layer of greater than about 5 percent, more preferably greater than about 20 percent. For example the porosity volume percent may be between about 5 percent and about 50 percent. For example, the silicon oxide based porous materials may include, but are not limited to, carbon doped silicon oxide and organo-silicate glass (OSG). The second dielectric layer 16 may be deposited by conventional CVD (e.g., PECVD, APCVD, and LPCVD) or spin-on processes.

Still referring to FIG. 1A, a third dielectric layer 14B, having the same preferred properties as the first dielectric layer 14A, is optionally formed over the second dielectric layer 16. In an important aspect of the invention, the thickness of the third dielectric layer is preferably 300 Angstroms or less. It will be appreciated that either or both of the first and the third dielectric layers, 14A and 14B, may be formed according to an aspect of the invention. More preferably, both the first and the third dielectric layers are formed to sandwich dielectric layer 16. Preferably the third dielectric layer 14B functions as a capping layer and/or a chemical mechanical polish (CMP) stop in a subsequent CMP process.

Figure 1B:
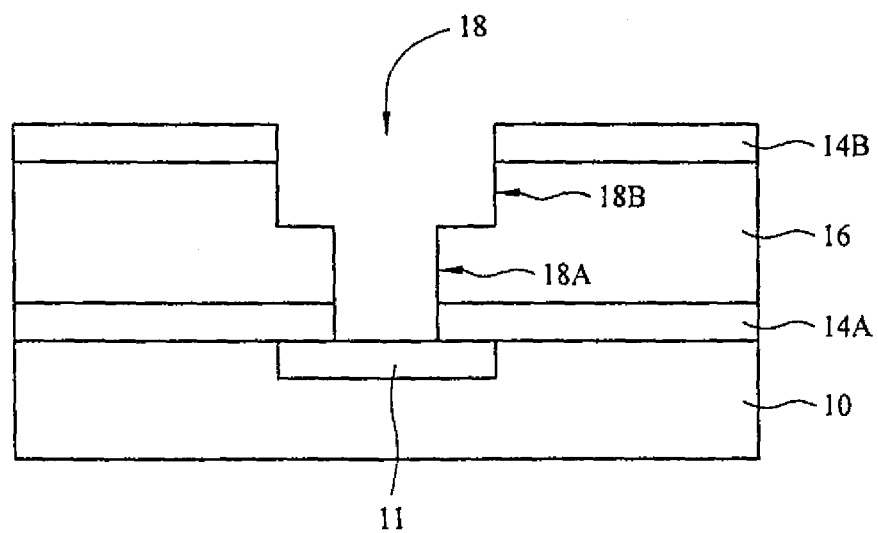

Referring to FIG. 1B, conventional photolithographic patterning and dry etching processes are carried out to form a dual damascene opening 18. For example, the dual damascene opening 18 may be formed by a via-first process where a first photolithographic patterning process is carried out to pattern and etch a via opening, followed by a second photolithographic patterning process to pattern and etch a trench opening overlying the via opening, to form a via portion e.g., 18A and a trench portion 18B. In an important aspect of the invention, the dual damascene structure e.g., opening 18 is formed without an intervening etch stop layer separating the via portion 18A, and the trench portion 18B. That is, the second dielectric layer 16 is formed having a contiguous thickness. The critical dimension (e.g., minimum width) of the trench portion is preferably less than about 120 nm and the critical dimension of the via portion (e.g., minimum diameter) is preferably less than about 100 nm. For example the via has a dimension of less than about 0.007 square microns.

Figure 1C:
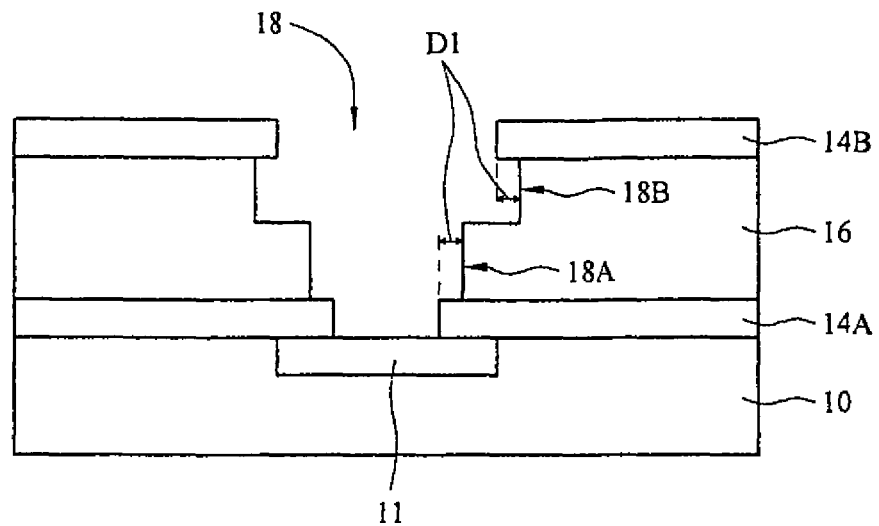

Referring to FIG. 1C, in another important aspect of the invention, a plasma assisted (dry) etching process is then carried out to selectively etch the sidewall portions of the second dielectric layer 16, thereby selectively enlarging (widening) the opening portion adjacent the second dielectric layer 16. The second dielectric layer 16 preferably has a higher selectivity to the plasma etching process with respect to the first and/or third dielectric layers, 14A and 14B. The plasma assisted etching process to selectively widen the opening 18 to form a laterally enlarged portion in dielectric layer 16, preferably includes molecular hydrogen ($H_2$) gas as an etchant plasma source gas. The etchant plasma source gas may additionally include ammonia ($NH_3$) or consist of only or primarily of ammonia ($NH_3$), but preferably does not include molecular nitrogen gas. Most preferably, the etchant plasma source gas consists of molecular hydrogen ($H_2$).

Exemplary plasma etching conditions for the selective dry etching process to form a laterally enlarged opening portion include a reactor chamber pressure of from about 1 to about 120 Torr; an RF power of about 400 to about 500 Watts in the absence of a bias power; a substrate temperature of from about 0 to about 100 degrees Centigrade; and, a hydrogen flow rate of from about 50 to about 500 standard cubic centimeters per minute (sccm). The anchoring structure can be formed by using various dry etching recipes during the processing of different dielectric layers.

Still referring to FIG. 1C, the enlarged opening portion forms a recessed step (anchoring step) with respect the underlying dielectric layer 14A and/or the overlying dielectric layer 14B, preferably having an enlarged lateral dimension e.g., D1, of from about 20 Angstroms to about 150 Angstroms, more preferably less than about 100 Angstroms. It is important that the enlarged lateral dimensions are less than about 1000 Angstroms It has been found that the preferred enlarged lateral dimensions are important to avoid an excessive stress being placed on the interconnect structures including the high density/low density dielectric layers thereby avoiding delamination events. In addition, the preferred enlarged lateral dimensions avoid an unacceptable change in design rules for the interconnect structures including trenches, vias, and contacts, thereby avoiding degradation of device performance while improving structural stability. In addition, an enlarged lateral dimension that is too large may induce an undesirable shadowing effect which adversely affects the deposition of barrier or seed layers.

Figure 1D:
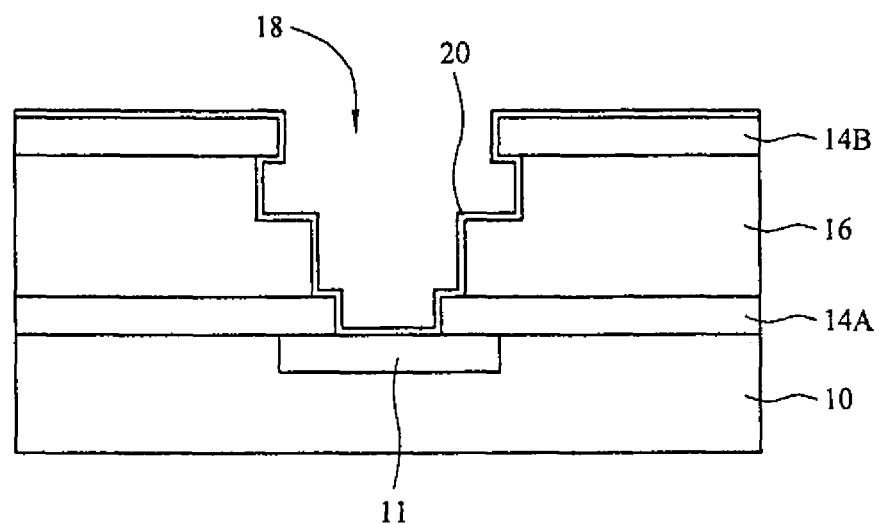

Referring to FIG. 1D, following formation of the enlarged portion of the dual damascene opening, a refractory metal and/or refractory metal nitride barrier layer 20 is formed. In one embodiment, the opening may be subjected to a plasma nitridation process to form a nitride liner layer (e.g., SiN or SiON) portion of the barrier layer at the surface of the dielectric layer portions e.g., 14A, 16, and 14B forming the dual damascene opening 18. The barrier layer 20, comprising a refractory metal including alloys or compounds thereof, preferably has a melting temperature higher than 1200° C. The preferable refractory metal and/or refractory metal nitride barrier layer will depend on the conductive filling. For example, for a copper conductive filling, the barrier layer 20 preferably includes Ta, TaN, Ru, metal nitride or other refractory material, alloys or combinations thereof. For example, barrier layer lining the opening, wherein the barrier layer comprises a refractory metal or alloys an compounds thereof having a melting temperature higher than 1200° For tungsten, aluminum, or CuAl conductive fillings, the barrier layer 20 preferably includes WN, Ti, TiN, TiSiN, metal nitride or combinations thereof. To further improve adhesive property between the ultra porous low k dielectric layer and the barrier layer 20, a dielectric liner formed by CVD or ALCVD can be deposited before the deposition of a barrier layer. Typically the dielectric liner is a silicon-containing dielectric formed by ALCVD.

Figure 1E:
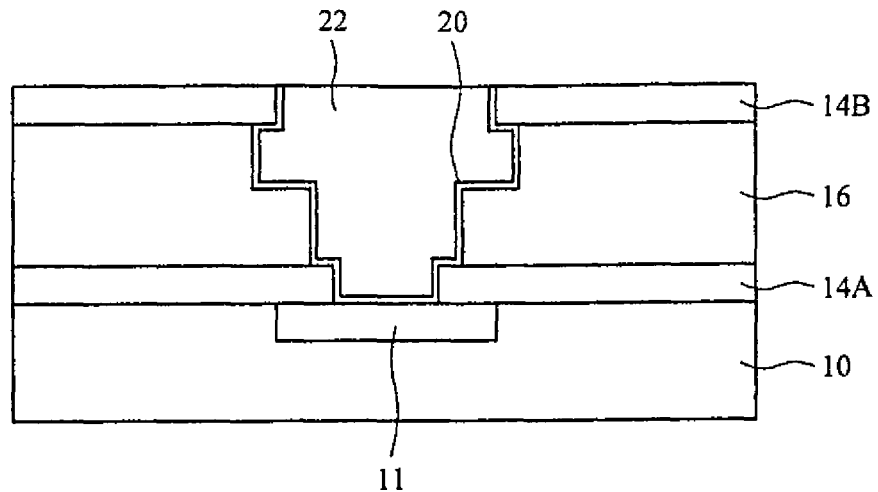

Referring to FIG. 1E, following barrier layer 20 formation, a conventional metal filling process is carried out to fill the dual damascene opening to form a metal filling e.g., 22. Depending on the conductive filling, a physical vapor deposition (PVD) (e.g., sputter deposition), CVD, or electroplating process may be carried out as is appropriate. For example, in the case of a copper filling, a metal seed layer, for example copper, is first deposited by a PVD process over the wafer surface including lining the opening with a contiguous layer followed by a convention electro-chemical deposition (ECD) process to deposit copper to fill the opening. Following the conductive filling process, a conventional chemical mechanical polish (CMP) process is carried out to remove excess material layers including the conductive material and the barrier layer 20 above the opening level to expose e.g., dielectric layer 14B and define the dual damascene including the buried conductive portion 22.

Figure 2A:
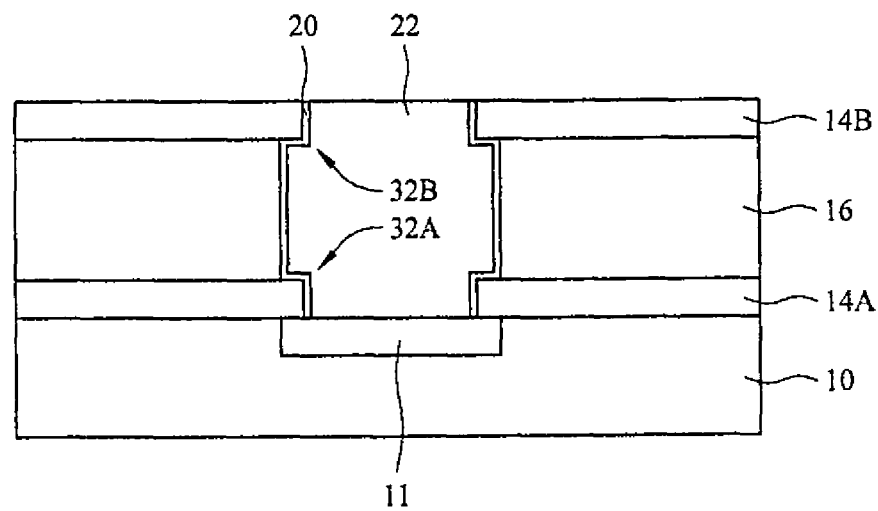
FIG. 2A shows a single damascene according to an embodiment of the present invention.

Referring to FIG. 2A, is shown a single damascene structure is formed by a similar process including the same preferred embodiments as the dual damascene structure except that only one photolithographic and dry etching process is carried out to form the initial single damascene opening. As in the dual damascene embodiment, a selective dry etching process according to the same preferred embodiments is carried out to form the laterally enlarged opening portion to form recessed anchoring steps e.g., 32A and/or 32B. As in the dual damascene process, it will be appreciated that the one or both of the dielectric layers 14A and 14B may be formed as a portion of an IMD layer. The anchoring steps may be formed to form a step e.g., 32A, at a lowermost level of the dielectric layer 16 overlying an uppermost portion of dielectric layer 14A and/or to form a step e.g., 32B, at an uppermost level of the dielectric layer 16 underlying a lowermost portion of dielectric layer 14B. In the single damascene embodiment, the low-K dielectric layer 16 is about 1500 Angstroms or greater in thickness, for example about 1500 Angstroms to about 3000 Angstroms.

Figure 2B:
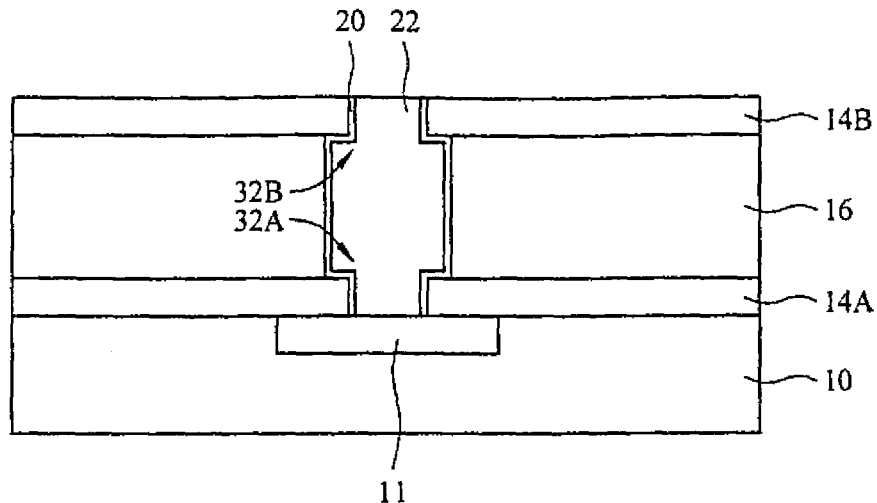
FIG. 2B shows a contact (via) according to an embodiment of the present invention.

Referring to FIG. 2B is shown a contact (via) structure formed by a similar process including the same preferred embodiments as the single damascene process. As in previous embodiments, a selective dry etching process according to the same preferred embodiments is carried out to form the anchoring step portions e.g., 32A and 32B. As in previous embodiments it will be appreciated that the one or both of the dielectric layers 14A and 14B may be formed, e.g., recessed portions may be formed at a lowermost level of the dielectric layer 16 exposing an uppermost potion of dielectric layer 14A and/or at an uppermost level of the dielectric layer 16 exposing a lowermost portion of dielectric layer 14B. In the contact (via) embodiment, the low-K dielectric layer 16 is preferably less than about 3000 Angstroms in thickness, for example from about 1200 to about 3000 Angstroms.

Figure 3:
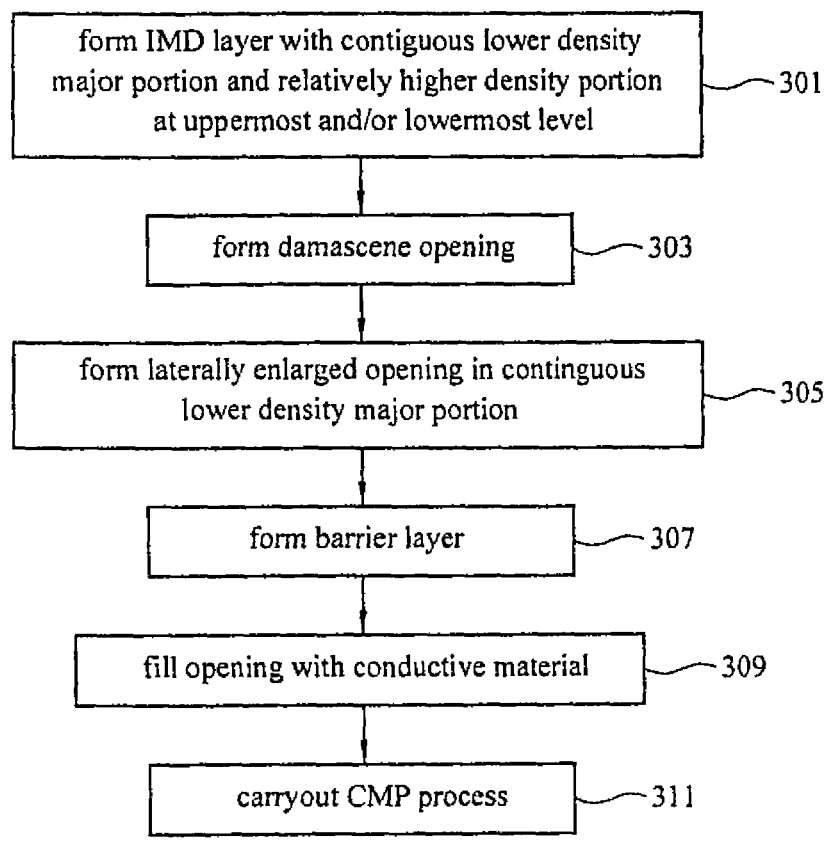
FIG. 3 is a process flow diagram including several embodiments of the present invention.

Referring to FIG. 3 is shown a process flow diagram including several embodiments of the present invention. In process 301, a multi-layer IMD layer is formed having a contiguous dielectric layer major portion having a relatively lower density and relatively higher density dielectric layer portions at a lowermost and/or uppermost level of the contiguous dielectric layer. In process 303, a damascene opening is formed extending through a thickness of the IMD layer. In process 305, the opening is laterally enlarged in the contiguous dielectric layer major portion to form at least one pair of recessed steps at an interface between higher density and lower density dielectric layer portions. In process 307, a barrier layer is formed to line the damascene opening. In process 309, a conductive material is deposited to fill the damascene opening. In process 311, a CMP process is carried out to remove excess material above the damascene opening. To reduce the capacitance and the circuit RC delay, the thickness of the uppermost dielectric layer is reduced to less than about 1000 Angstroms and preferably to less than about 500 Angstroms after CMP.

Thus, a method of forming an anchored damascene has been presented which has the advantages of a simple process flow while improving a conductive filling stability according to anchoring steps formed in either or both the lower and upper portions of an IMD layer. As a result, a resistance to stress migration and peeling of IMD layers and/or conductive fillings is improved with respect to subsequent processing steps including CMP. Semiconductor device reliability and yield is thereby improved.

The preferred embodiments, aspects, and features of the invention having been described, it will be apparent to those skilled in the art that numerous variations, modifications, and substitutions may be made without departing from the spirit of the invention as disclosed and further claimed below.

What is claimed is:

1. A method for forming an anchored damascene structure comprising the steps of:
   providing a material layer having a conductive region on top;
   forming a dielectric layer on top of said conductive region, said dielectric layer comprises at least two relatively higher density portions and a relatively lower density portion, said relatively lower density portion sandwiched between said at least two relatively higher density portions, said lower density portion forming a contiguous major portion of the dielectric layer, said lower density potion without an intervening etch stop layer;
   forming an opening in and through a thickness of said dielectric layer;
   following forming said opening, enlarging a lateral dimension of said opening in the lower density portion in a single etch step to produce an enlarged opening along an entirety of said thickness having said lateral dimension larger than the opening in said at least two relatively higher density portions thereby forming at least one anchoring step, said lateral dimension comprising a second lateral dimension extending laterally on either side of the opening at an interface with each of the relatively higher density portions;
   filling said opening with a conductive material; and,
   forming said conductive material to have an uppermost portion substantially co-planar with a respective uppermost portion of said dielectric layer.

2. The method for forming an anchored damascene structure according to claim 1, wherein said damascene structure is selected from the group consisting of a dual damascene structure and a single damascene structure.

3. The method for forming an anchored damascene structure according to claim 2 further comprising the step of forming said dual damascene structure comprises a via portion and a trench portion over the via portion, and forming the width of the trench portion to equal or less than about 0.1 micron.

4. The method for forming an anchored damascene structure according to claim 1 further comprising the step of forming a lowermost portion of the relatively higher density portions of the dielectric layer to less than 500 Angstroms in thickness, and forming an uppermost portion of the relatively higher density portions of the dielectric layer to less than about 1000 Angstroms in thickness.

5. The method for forming an anchored damascene structure according to claim 1 wherein the step of forming said at least one anchoring step comprises forming said second lateral dimension to a dimension between about 20 Angstroms and about 150 Angstroms.

6. The method for forming an anchored damascene structure according to claim 1 further comprising the step of forming said least two relatively higher density portions of the dielectric layer by a material having a dielectric constant between about 2.5 and about 5.0.

7. The method for forming an anchored damascene structure according to claim 1 further comprising the step of forming said lower density portion of the dielectric layer by a material having a dielectric constant of not higher than 2.7.

8. The method for forming an anchored damascene structure according to claim 1 further comprising the step of forming said lower density portion of the dielectric layer with a porosity of at least about 5%.

9. The method for forming an anchored damascene structure according to claim 1 further comprising the step of forming said lower density portion of the dielectric layer with a porosity larger than about 20%.

10. The method for forming an anchored damascene structure according to claim 1 further comprising the step of forming said at least one anchoring step by an etchant having a higher selectivity toward said lower density portion of the dielectric layer.

11. The method for forming an anchored damascene structure according to claim 1, wherein the lower density portion of the dielectric layer has a higher rate of etching in a plasma etching process using a fluorocarbon (CxFy) compared to a rate of etching of said at least two higher density portions.

12. The method for forming an anchored damascene structure according to claim 1 further comprising the step of forming said at least two higher density portions of the dielectric layer by a material comprises carbon, nitrogen, and oxygen.

13. The method for forming an anchored damascene structure according to claim 1 further comprising the step of forming said lower density portion of the dielectric layer by a material selected from the group consisting of carbon doped silicon oxide and organo-silicates.

14. The method for forming an anchored damascene structure according to claim 1 further comprising the step of depositing a barrier layer in said opening prior to said filling step, said barrier layer comprises a refractory metal having a melting temperature of at least 1200° C.

15. The method of claim 1 wherein said etch step comprises a plasma etch chemistry comprising hydrogen and not comprising nitrogen.

16. A method for forming an anchored damascene structure in a multi-density dielectric layer comprising the steps of:

providing a material layer having a conductive region on top;

forming a dielectric layer on top of said conductive region, said dielectric layer comprises at least two relatively higher density portions and a relatively lower density portion, said relatively lower density portion sandwiched between said at least two relatively higher density portions, said lower density portion forming a contiguous major portion of the dielectric layer, said lower density portion without an intervening etch stop layer;

forming an opening in and through a thickness of said dielectric layer by at least one photolithographic process;

following forming said opening, enlarging a lateral dimension of said opening including forming at least one anchoring step in said opening in a single etch step by an etchant having a higher selectivity toward said lower density portion of the dielectric layer to produce an enlarged opening along an entirety of said thickness having said lateral dimension larger than the opening in said at least two relatively higher density portions thereby forming at least one anchoring step, said lateral dimension comprising a second lateral dimension extending laterally about the same distance on either side of the opening at an interface with each of the relatively higher density portions;

depositing a barrier layer on a sidewall of said opening;

filling said opening with a conductive material; and, forming said conductive material to have an uppermost portion substantially co-planar with a respective uppermost portion of said dielectric layer.

17. The method for forming an anchored damascene structure according to claim 16 wherein the step of forming said opening comprises forming a dual damascene structure by two photolithographic processes.

18. The method for forming an anchored damascene structure according to claim 16 wherein said second lateral dimension comprises a dimension between about 20 Angstroms and about 150 Angstroms.

19. The method for forming an anchored damascene structure according to claim 16 further comprising the step of forming a lowermost portion of the relatively higher density portions of the dielectric layer to less than 500 Angstroms in thickness, and forming an uppermost portion of the relatively higher density portions of the dielectric layer to less than about 1000 Angstroms in thickness.

20. The method of claim 16 wherein said etch step comprises a plasma etch chemistry comprising hydrogen and not comprising nitrogen.

* * * * *